(12) United States Patent
Abdellatif et al.

(10) Patent No.: US 11,474,079 B2
(45) Date of Patent: Oct. 18, 2022

(54) ULTRASONIC DRY COUPLED WHEEL PROBE WITH A RADIAL TRANSDUCER

(71) Applicant: Saudi Arabian Oil Company, Dhahran (SA)

(72) Inventors: Fadi Abdellatif, Thuwal (SA); Sahejad Patel, Thuwal (SA)

(73) Assignee: Saudi Arabian Oil Company, Dhahran (SA)

( * ) Notice: Subject to any disclaimer, the term of this patent is extended or adjusted under 35 U.S.C. 154(b) by 190 days.

(21) Appl. No.: 16/865,915

(22) Filed: May 4, 2020

(65) Prior Publication Data

US 2021/0341431 A1    Nov. 4, 2021

(51) Int. Cl.
*G01N 29/22* (2006.01)
*G01N 29/04* (2006.01)
(Continued)

(52) U.S. Cl.
CPC .......... *G01N 29/221* (2013.01); *B06B 1/0655* (2013.01); *G01N 29/043* (2013.01);
(Continued)

(58) Field of Classification Search
CPC ........... G01N 29/221; G01N 2291/106; G01N 2291/2634; G01N 29/043; G01N 29/2437;
(Continued)

(56) References Cited

U.S. PATENT DOCUMENTS 2,724,783 A    11/1955  Renaut
2,795,709 A    11/1957  Camp
(Continued)

FOREIGN PATENT DOCUMENTS

GB    1238580 A    7/1971

OTHER PUBLICATIONS

Red' Ko et al., "An Ultrasonic Rolling Transducer", Soviet Journal of Nondestructive Testing, Consultants Bureau, Nov. 1977, pp. 711-712.
(Continued)

*Primary Examiner* — Randy W Gibson
*Assistant Examiner* — John M Royston
(74) *Attorney, Agent, or Firm* — Leason Ellis LLP (57) ABSTRACT

An ultrasonic dry coupled wheel probe with radial transducers emit ultrasound in substantially all radial directions relative to a longitudinal axis. The probe does not require normalization and is efficient in directing ultrasound to a surface being inspected. The probe has a wheel composed of rubber or other materials for acoustically dry coupling the transducer to the surface. A first transducer is composed of a piezoelectric material so that the transducer receives an electrical signal, vibrates, and generates and transmits sound, such as ultrasound. Similarly, a second transducer receives sound such as ultrasound, vibrates, and generates a corresponding electrical signal. The transducer arrangement both transmits ultrasound to the surface and receives the reflection of the ultrasound from the surface. An acoustic barrier separates the transmitting component from the receiving component. The transducer has annular electroplates adjacent to the piezoelectric material. The two transducers can comprise a single, integrated transducer module.

14 Claims, 7 Drawing Sheets

(51) Int. Cl.
*B06B 1/06* (2006.01)
*G01N 29/28* (2006.01)
*H01L 41/113* (2006.01)
*G01N 29/24* (2006.01)
*G01N 29/32* (2006.01)

(52) U.S. Cl.
CPC ..... *G01N 29/2437* (2013.01); *G01N 29/2493* (2013.01); *G01N 29/28* (2013.01); *G01N 29/32* (2013.01); *G01N 2291/0289* (2013.01); *G01N 2291/044* (2013.01); *G01N 2291/101* (2013.01); *G01N 2291/102* (2013.01); *G01N 2291/106* (2013.01); *G01N 2291/2634* (2013.01); *H01L 41/1132* (2013.01)

(58) Field of Classification Search
CPC .......... G01N 29/32; G01N 2291/0289; G01N 2291/044; G01N 2291/101; G01N 2291/102; G01N 29/28; G01N 29/2493; B06B 1/0655; H04R 17/10; H01L 41/1132
See application file for complete search history.

(56) References Cited

U.S. PATENT DOCUMENTS

| | | | |
|---|---|---|---|
| 3,094,314 A | 6/1963 | Kearney et al. | |
| 3,423,991 A | 1/1969 | Collins | |
| 3,678,737 A | 7/1972 | Miller | |
| 3,698,051 A | 10/1972 | Miller | |
| 3,732,444 A | 5/1973 | Miller | |
| 4,347,593 A | 8/1982 | Trott | |
| 4,519,251 A | 5/1985 | Dickson | |
| 4,596,146 A | 6/1986 | Usmar et al. | |
| 4,615,218 A * | 10/1986 | Pagano | G01N 29/2493 73/639 |
| 4,763,526 A | 8/1988 | Pagano | |
| 4,821,244 A | 4/1989 | Wood | |
| 5,199,004 A | 3/1993 | Monahan | |
| 5,225,731 A | 7/1993 | Owen | |
| 5,583,293 A | 12/1996 | Flögel | |
| 2004/0045358 A1 | 3/2004 | Wagner et al. | |
| 2017/0292936 A1 | 10/2017 | Bjerke et al. | |

OTHER PUBLICATIONS

A.M. Robinson A M et al., "Dry-coupled low-frequency ultrasonic wheel probes: application to adhesive bond inspection", NDT&E International, Jan. 2003, pp. 27-36.

Komsky, "Rolling dry-coupled transducers for ultrasonic inspections of aging aircraft structures", Inhealth Monitoring and Smart Nondestructive Evaluation of Structural and Biological Systems III, Jul. 2004, pp. 201-209.

International Search Report and Written Opinion in corresponding application No. PCT/US2021/030549 dated Aug. 16, 2021.

"Introduction to Ultrasonic Drivers." www.piezodrive.com, www.piezodrive.com/ultrasonic-drivers/intro-ultrasonic/. Accessed Mar. 5, 2020.

Drinkwater, Bruce, and Peter Cawley. "An ultrasonic wheel probe alternative to liquid coupling." Review of Progress in Quantitative Nondestructive Evaluation. Springer, Boston, MA, 1995. 983-989.

Yochev, Bogomil, et al. "Investigation of ultrasonic properties of hydrophilic polymers for dry-coupled inspection." Proceedings of the European Conference on Non-Destructive Testing, Bedin, Germany. 2006.

* cited by examiner

ULTRASONIC DRY COUPLED WHEEL PROBE WITH A RADIAL TRANSDUCER

FIELD OF THE DISCLOSURE

The present disclosure relates generally to ultrasonic wheel probes, and, more particularly, to an ultrasonic dry coupled wheel probe with a radial transducer.

BACKGROUND OF THE DISCLOSURE

The use of directional sensors such as ultrasonic dry coupled wheel probes is common during inspection activities, such as the inspecting of curved structures, irregularly shaped structures, or combinations of the two, including, by way of example and not limitation, pipes and other conduits in the oil and gas industry. Dry coupled wheel probes do not require any intervening acoustical coupling substances such as gels or liquids. For this reason, they are preferable to other types of wheel probes which require an additional non-dry coupling substance.

Known ultrasonic wheel probes are employed to perform thickness measurements of surfaces of such structures being inspected. Such known wheel probes may use a piezoelectric ultrasonic transducer. However, such known wheel probes require normalization to orient the transducer within the wheel probe to cause the ultrasound from the transducer to be emitted perpendicular to the surface being inspected. Perpendicular emission is necessary since the piezoelectric transducer within the wheel probe vibrates in a linear mode to produce the ultrasonic signal in a narrow and generally linear direction which is used for the thickness measurements. Such linear mode vibrations result in inefficiencies in the thickness measurements due to occasional misdirection of the ultrasound towards the structure being measured. Hence, it is necessary to orient the ultrasonic emissions from the transducer directly towards the surface being inspected, in order to increase the efficiency of the measurement operation.

SUMMARY OF THE DISCLOSURE

According to an embodiment consistent with the present disclosure, an ultrasonic dry coupled wheel probe with a radial transducer emits ultrasound in substantially all radial directions, and so does not require normalization yet is efficient in directing ultrasound to a surface being inspected. Accordingly, the need for normalization is eliminated, and the use of dry coupled wheel probes can be expanded into numerous inspection applications.

The wheel probe has a wheel composed of rubber or other known materials for acoustically dry coupling the transducer to the surface. The transducer module is composed of a piezoelectric material so that a first transducer receives an electrical signal, vibrates, and generates and transmits sound, such as ultrasound. Similarly, a second transducer receives sound such as ultrasound, vibrates, and generates a corresponding electrical signal. The transducer module has a transmitting component for transmitting the ultrasound to the surface and has a receiving component for receiving the reflection of the ultrasound from the surface. An acoustic barrier separates the transmitting component from the receiving component. The transducer has annular electroplates adjacent to the piezoelectric material. The first and second transducers can comprise a single, integrated transducer module.

In an embodiment, a transducer module includes a first transducer comprising a first cylindrical member having a longitudinal axis; a first electroplate adjacent to the first cylindrical member; and a second electroplate adjacent to the first cylindrical member; wherein the first and second electroplates apply a first electrical signal to the first cylindrical member to generate and emit sound waves in substantially all radial directions relative to the longitudinal axis. The emitted sound waves are ultrasonic waves. The first and second electroplates have an annular shape. The first cylindrical member is composed of a piezoelectric material. The transducer module further includes a second transducer comprising a second cylindrical member; a third electroplate adjacent to the second cylindrical member; and a fourth electroplate adjacent to the second cylindrical member; wherein, responsive to the second cylindrical member receiving a reflection of the sound waves from a test surface, the second cylindrical member vibrates, causing the third and fourth electroplates to generate a corresponding second electrical signal. The third and fourth electroplates have an annular shape. The second cylindrical member is composed of a piezoelectric material.

In another embodiment, a transducer module includes: a transmitting component including a first cylindrical member having a first longitudinal axis; a first electroplate adjacent to the first cylindrical member; and a second electroplate adjacent to the first cylindrical member; a receiving component including: a second cylindrical member having a second longitudinal axis; a third electroplate adjacent to the second cylindrical member; and a fourth electroplate adjacent to the second cylindrical member; and an acoustic barrier positioned between the transmitting component and the receiving component; wherein the first and second electroplates apply a first electrical signal to the first cylindrical member to generate and emit sound waves from the transmitting component in substantially all radial directions relative to the first longitudinal axis; wherein the acoustic barrier substantially prevents the emitted sound waves from the transmitting component from being received by the receiving component; and wherein, responsive to the receiving component receiving a reflection of the sound waves from a test surface, the second cylindrical member vibrates, causing the third and fourth electroplates to generate a corresponding second electrical signal. The emitted sound waves are ultrasonic waves. Each of the first and second cylindrical members is composed of a piezoelectric material. Each of the first, second, third, and fourth electroplates has an annular shape with a centrally positioned electroplate aperture and a longitudinal electroplate axis coincident with a respective longitudinal cylindrical axis of the first and second cylindrical members. In an embodiment, the first and second electroplates are concentric rings; and the third and fourth electroplates are concentric rings. In another embodiment, the first and second electroplates are parallel discs; and the third and fourth electroplates are parallel discs. Any of the foregoing embodiments can comprise a single, integrated transducer module for inclusion in a variety of articles of manufacture, including, without limitation, a wheel probe such as a dry-coupled wheel probe.

In a further embodiment, a wheel probe for inspecting a test surface of a structure includes: a transducer module including: a transmitting component comprising: a first cylindrical member having a first longitudinal axis; a first electroplate adjacent to the first cylindrical member; and a second electroplate adjacent to the first cylindrical member; a receiving component including: a second cylindrical member having a second longitudinal axis; a third electroplate adjacent to the second cylindrical member; and a fourth electroplate adjacent to the second cylindrical member; and a static acoustic barrier positioned between the transmitting component and the receiving component; a pair of wheel members composed of a predetermined material for acoustically dry coupling the wheel members to the test surface; and a rotating acoustic barrier between the wheel members, forming a wheel which rotates about the transducer; wherein the first and second electroplates apply a first electrical signal to the first cylindrical member to generate and emit sound waves from the transmitting component in substantially all radial directions relative to the longitudinal axis; wherein the static and rotating acoustic barriers substantially prevent the emitted sound waves from the transmitting component from being received by the receiving component; and wherein, responsive to the receiving component receiving a reflection of the sound waves from the test surface, the second cylindrical member vibrates, causing the third and fourth electroplates to generate a corresponding second electrical signal.

In an additional embodiment, a system for inspecting a test surface of a structure comprises: a transducer module having a longitudinal axis, the transducer generating and emitting sound waves in substantially all radial directions relative to the longitudinal axis, receiving a reflection of the sound waves from the test surface, and generating a corresponding electrical signal; and a controller controlling the transducer module and digitizing the electrical signal. The controller includes a digitizer for digitizing the electrical signal. The transducer module includes a first piezoelectric crystal generating and emitting the sound waves. The transducer module includes a second piezoelectric crystal receiving the reflection of the sound waves from the test surface and generating the corresponding electrical signal. Alternatively, the first piezoelectric crystal receives the reflection of the sound waves from the test surface and generates the corresponding electrical signal. The controller controls the first piezoelectric crystal to be in a transmitting mode for generating and emitting the sound waves, and to be in a receiving mode for receiving the reflection of the sound waves from the test surface and generating the corresponding electrical signal.

In a further embodiment, a method comprises positioning a probe with a transducer module adjacent to a test surface to be inspected, wherein the transducer module has a longitudinal axis; generating a first electrical signal from a controller; applying the first electrical signal to the transducer module to generate and emit sound waves in substantially all redial directions relative to the longitudinal axis; receiving a reflection of the sound waves at the transducer module; generating and emitting a second electrical signal from the transducer module; and digitizing the second electrical signal to inspect the test surface. The transducer module includes a first piezoelectric crystal configured to generate and emit the sound waves. The transducer module includes a second piezoelectric crystal configured to receive the reflection of the sound waves from the test surface and generate and emit the corresponding electrical signal. Alternatively, the first piezoelectric crystal receives the reflection of the sound waves from the test surface and generates the corresponding electrical signal. The controller controls the first piezoelectric crystal to be in a transmitting mode for generating and emitting the sound waves, and to be in a receiving mode for receiving the reflection of the sound waves from the test surface and generating the corresponding electrical signal.

In various embodiments consistent with the foregoing, the predetermined material comprises rubber. Also, in various embodiments consistent with the foregoing, each of the first, second, third, and fourth electroplates has an annular shape with a centrally positioned electroplate aperture and a longitudinal electroplate axis coincident with a respective longitudinal cylindrical axis of the first and second cylindrical members. In various embodiments, each of the electroplates either comprises concentric rings or parallel discs.

Any combinations of the various embodiments and implementations disclosed herein can be used in a further embodiment, consistent with the disclosure. These and other aspects and features can be appreciated from the following description of certain embodiments presented herein in accordance with the disclosure and the accompanying drawings and claims.

BRIEF DESCRIPTION OF THE DRAWINGS

It is noted that the drawings are illustrative and are not necessarily to scale.

DETAILED DESCRIPTION OF CERTAIN EMBODIMENTS OF THE DISCLOSURE

Figure 1:
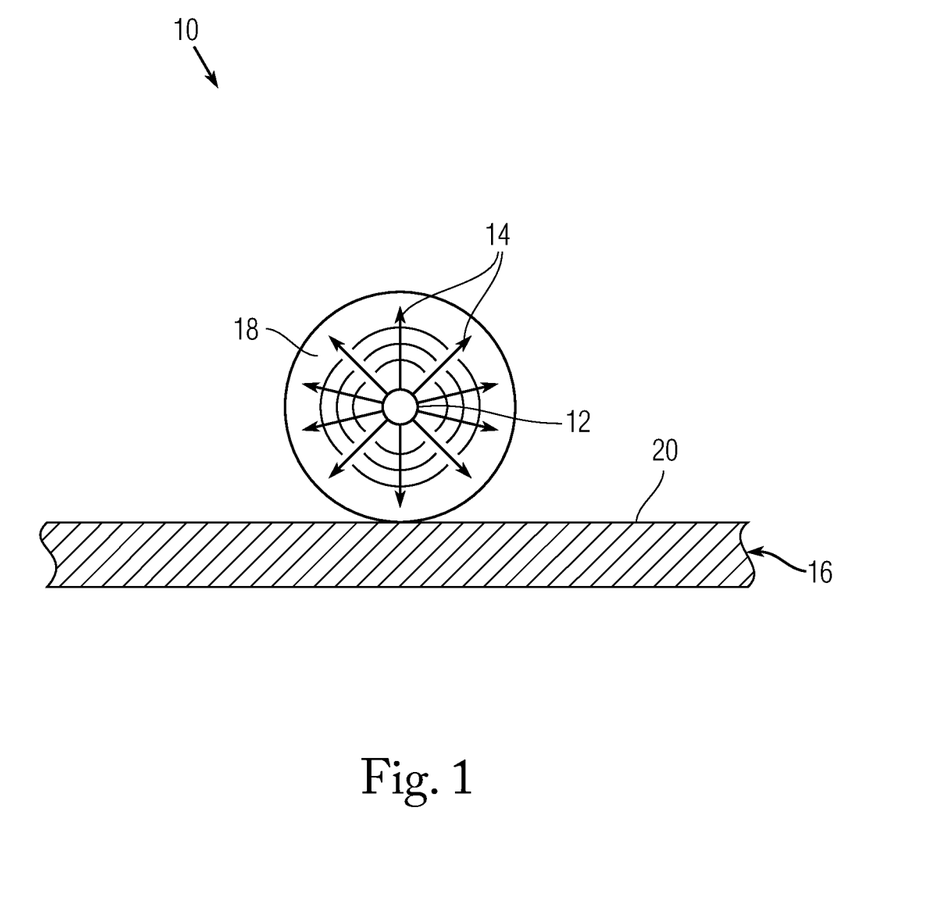
FIG. 1 is a diagram of a side cross-sectional view of an ultrasonic dry coupled wheel probe with a radial transducer radially emits ultrasound, according to an embodiment.

Example embodiments of the transducer arrangement consistent with the teachings included in the present disclosure are directed to the use case of an ultrasonic dry coupled wheel probe 10, as shown in FIG. 1, with a radial transducer module 12 which emits ultrasound 14 in substantially all radial directions relative to a longitudinal axis for measuring pipes, conduits, and other structures 16. Such radial directions are radial relative to a longitudinal rotational axis of the wheel probe 10. As compared to prior art approaches, which require accurate normalization of the transducers relative to a surface being measured, and further require that such normalization be repeatedly performed to obtain accurate measurements of structures, the arrangements of the present disclosure do not require normalization at all. Moreover, the arrangements disclosed herein are efficient in directing ultrasound to a surface being inspected.

The transducer module 12 in certain implementations is comprised of a piezoelectric material, so that the transducer module 12 receives an electrical signal, vibrates, and generates and transmits sound, such as ultrasound. Similarly, the transducer module 12 receives sound such as ultrasound, vibrates, and generates a corresponding electrical signal. Other known materials other than piezoelectric materials can be substituted for use in the transducer module 12.

The probe 10 is configured with a dry coupled wheel 18 to be rolled over the surface 20 of the structure 16. The surface 20 is a "test" surface that is being inspected, measured, or both inspected and measured using the probe 10. The wheel 16 is composed of rubber or other known material compositions which acoustically couples the transducer module 12 to the surface 20 in a dry coupling configuration. In this arrangement, the ultrasound 14 passes through the wheel 18 to the surface 20 with little or no loss of the ultrasonic signal. Since the wheel 18 is composed of a dry couplant, no gel or liquid couplant is required to be disposed between the wheel 18 and the surface 20. The ultrasound 14 is radially emitted from the transducer module 12, in accordance with the present disclosure, and has the ultrasound 14 emitted in substantially all radial directions relative to the rotational axis of the wheel 16. As such, the ultrasonic emissions are coincident with a shaft of the wheel 16 and therefore eliminate the need for normalization of the transducer module 12.

Figure 2:
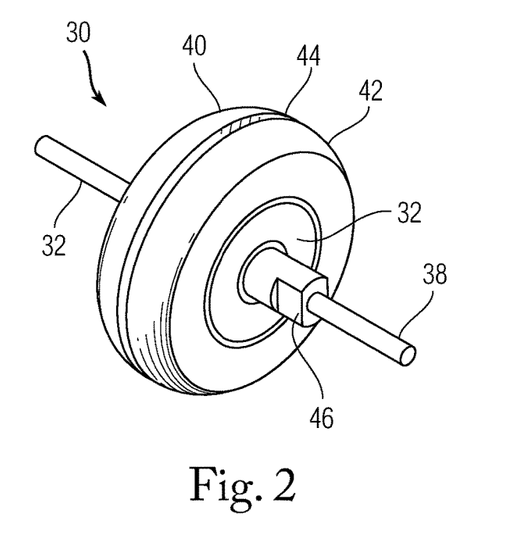
FIG. 2 is a diagram of a top front side perspective view of an ultrasonic dry coupled wheel probe with a radial transducer, according to an embodiment.

As shown in FIGS. 2-5, a first embodiment of the present disclosure is an ultrasonic dry coupled wheel probe 30 with a radial transducer module 32. The wheel probe 30 is capable of rotating about the transducer module 32, shaft 38, or both the transducer module and shaft. As shown in FIG. 2, the probe 30 has wheel members 40, 42 separated by a rotating acoustic barrier 44 therebetween, with the combination of elements 40, 42, 44 forming the wheel of the wheel probe 30 which rotates about the transducer module 32, shaft 38, or both the transducer module and shaft. The wheel members 40, 42 are composed of rubber or other known material compositions which acoustically couples the transducer 32 to a surface of a structure being inspected in a dry coupling configuration. The wheel members 40, 42 can all rotate independently of the transducer module 32. The wheel members 40, 42 can also rotate independently of the acoustic barrier 44. In a further alternative embodiment, the wheel members 40, 42 can all rotate together with the acoustic barrier 44 and the transducer module 32 as a rigid assembly. The acoustic barrier 44 ensures that the wheel members 40, 42 are separated acoustically.

Figure 3:
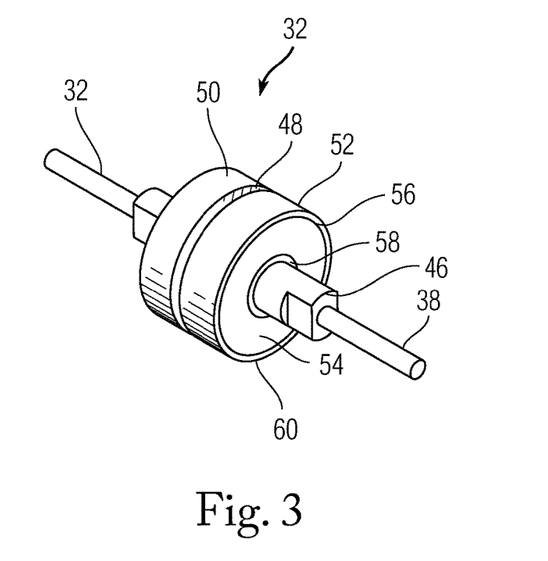
FIG. 3 is a diagram of a top front side perspective view of the radial transducer of FIG. 2, according to an embodiment.

As shown in FIG. 3, the transducer module 32 has a body 46 including a static acoustic barrier 48 between a transmitting component 50 and a receiving component 52. The acoustic barriers 44, 48 prevent cross-talk between the components 50, 52. That is, ultrasound emitted by the transmitting component 50 is prevented or minimized from being directly received by the receiving component 52. As such, the receiving component 52 only receives a reflection of the emitted ultrasound which is reflected by the surface of the structure being measured. Each of the components 50, 52 of the transducer module 32 includes an annular piezoelectric member 54 having an outer annular electroplate 56 and an inner annular electroplate 58, with a protective cover 60 surrounding the outer annular electroplate 56. The annular electroplates 56, 58 form concentric rings with a central axis coincident with the central axis of the components 50, 52.

Figure 4:
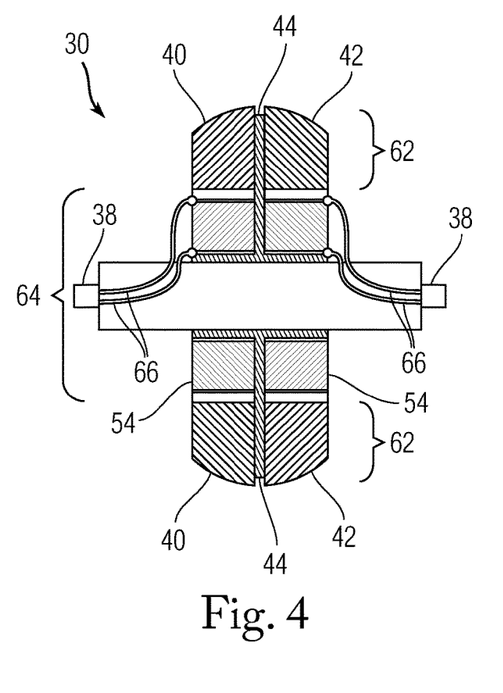
FIG. 4 is a diagram of a side cross-sectional view of the ultrasonic dry coupled wheel probe with the radial transducer of FIG. 2, according to an embodiment.
Figure 5:
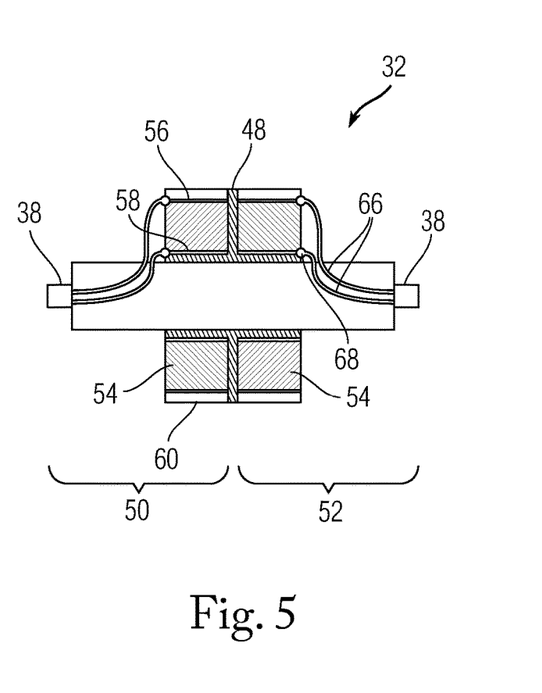
FIG. 5 is a diagram of a side cross-sectional view of the radial transducer of FIG. 2, according to an embodiment.

As shown in FIG. 4, the rotating wheel members 40, 42 and the rotating acoustic barrier 44 form a rotor 62 which rotates about the transducer module 32 which forms a stator 64. As shown in FIGS. 4-5, electrical wires 66 leading from the shaft 38 are joined to the electroplates 56, 58 by connectors 68, such as solder joints. An electrical signal from a measuring device is applied to the electroplates 56, 58 of the transmitting component 50 through the wires 66. The signal causes the piezoelectric member 54 to vibrate and generate ultrasound radially in substantially all radial directions relative to the shaft 38, such as towards a surface of a structure being inspected. Reflections of such ultrasound from the surface cause the piezoelectric member 54 of the receiving component 52 to vibrate, which in turn generates an electrical signal in the electroplates 56, 58 of the receiving component 52. Such a generated electrical signal is then conveyed through the wires 66 connected to the electroplates 56, 58 of the receiving component 52, and thence to the measuring device. At the measuring device, subsequent signal processing can be employed to determine the characteristics of the surface or the structure being inspected. Unlike conventional approaches, however, normalization or repeated normalization confirmations are not required to ensure that the signals provided to the measuring device are, in fact, accurate measurements, due to the radial construction of the transducer module.

Figures 6, 7:
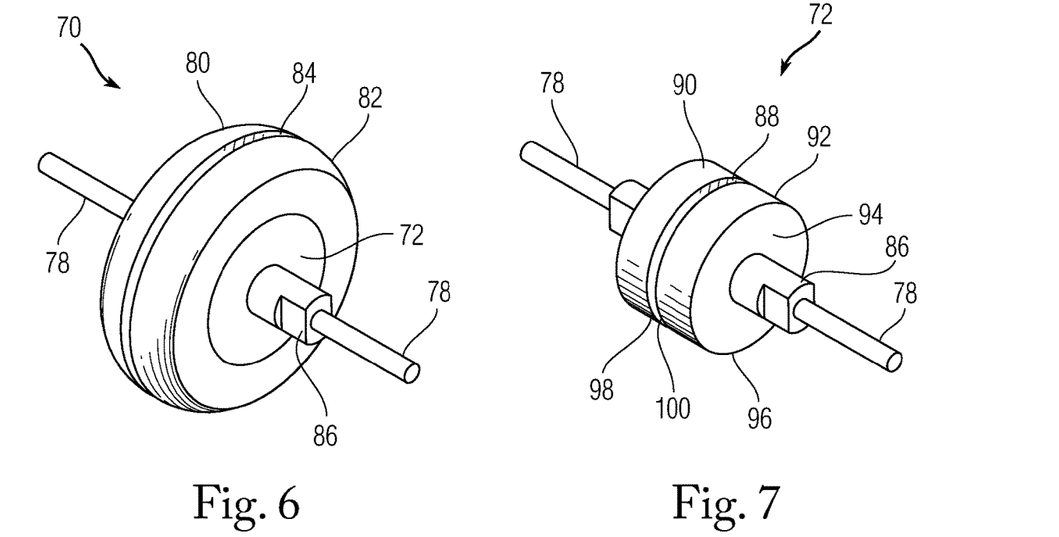
FIG. 6 is a diagram of a top front side perspective view of an ultrasonic dry coupled wheel probe with a radial transducer, according to another embodiment.
FIG. 7 is a diagram of a top front side perspective view of the radial transducer of FIG. 6, according to another embodiment.

As shown in FIGS. 6-9, a second embodiment of the present disclosure provides an ultrasonic dry coupled wheel probe 70 with a radial transducer module 72. The wheel probe 70 is capable of rotating about the transducer module 72, a shaft 78, or both structures. As shown in FIG. 6, the probe 70 has wheel members 80, 82 separated by a rotating acoustic barrier 84 therebetween, with the combination of elements 80, 82, 84 forming the wheel of the wheel probe 70 which rotates about the transducer module 72, the shaft 78, or both the transducer module and shaft. The wheel members 80, 82 are composed of rubber or other known material compositions which acoustically couples the transducer module 72 to a surface of a structure being inspected in a dry coupling configuration. As shown in FIG. 7, the transducer module 72 has a body 86 including a static acoustic barrier 88 between a transmitting component 90 and a receiving component 92. The acoustic barriers 84, 88 prevent cross-talk between the components 90, 92. That is, ultrasound emitted by the transmitting component 90 is prevented or minimized from being directly received by the receiving component 92. As a consequence, the receiving component 92 only receives a reflection of the emitted ultrasound which is reflected by the surface of the structure being measured. Each of the components 90, 92 of the transducer module 72 includes an annular piezoelectric member 94 having an outer annular electroplate 96 and a respective inner annular electroplate 98, 100, with each inner annular electroplate 98, 100 being adjacent to the static acoustic barrier 88. The outer annular electroplates 96 and the inner annular electroplates 98, 100 form parallel discs with a central axis coincident with the central axis of the components 90, 92.

Figure 8:
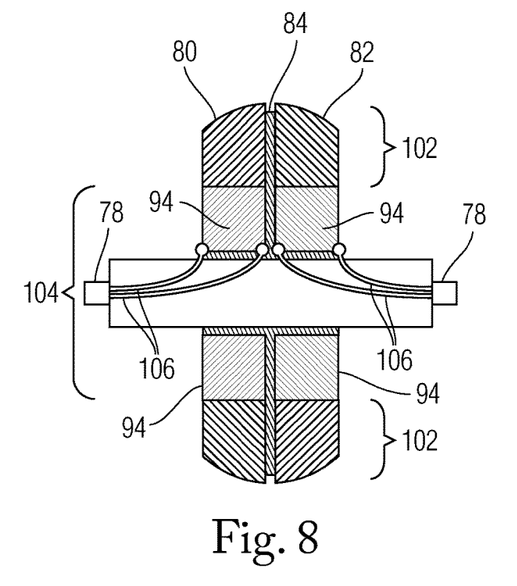
FIG. 8 is a diagram of a side cross-sectional view of the ultrasonic dry coupled wheel probe with the radial transducer of FIG. 6, according to another embodiment.

As shown in FIG. 8, the rotating wheel members 80, 82 and the rotating acoustic barrier 84 form a rotator 102 which rotates about the transducer module 72. In this arrangement, the transducer module 72 defines a stator 104.

Figure 9:
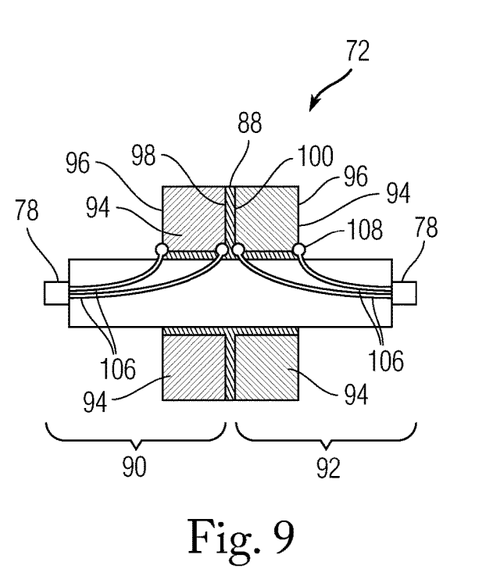
FIG. 9 is a diagram of a side cross-sectional view of the radial transducer of FIG. 6, according to another embodiment.

As shown in FIGS. 8-9, electrical wires 106 leading from the shaft 78 are joined to the electroplates 96, 98, 100 by connectors 108, such as solder joints. A first electrical signal from a measuring device is applied to the electroplates 96 of the transmitting component 90 through the wires 106. This first electrical signal causes the piezoelectric member 94 to vibrate and generate ultrasound radially in substantially all radial directions relative to the shaft 78, such as towards a surface of a structure being inspected. In this embodiment, the vibrations and subsequent radially emitted ultrasound are generated by the piezoelectric member 94 which are induced indirectly by the electroplates 96, 98 through the Poisson effect. Accordingly, the piezoelectric member 94 is excited in the axial direction by the application of the first electrical signal to the electroplates 96, 98, and so the piezoelectric member 94 vibrates in such a way that the thickness of piezoelectric member 94 along the longitudinal axis, coincident with the shaft 78, oscillates. When the thickness contracts, the radial diameter of the piezoelectric member 94 expands, and when the thickness expands, the radial diameter contracts. Therefore, the primary axial vibrations induce secondary radial vibrations causing ultrasound to be generated and transmitted radially through the wheel component 80, which is composed of rubber or other dry coupling material, and which surrounds and rotates around the transmitting component 90.

Reflections of such ultrasound from the surface causes the piezoelectric member 94 of the receiving component 92 to vibrate, which in turn generates a second electrical signal in the electroplates 98, 100 of the receiving component 92. The second electrical signal is conveyed through the wires 106 connected to the electroplates 98, 100 of the receiving component 92, and thereafter to the measuring device for subsequent signal processing to determine the characteristics of the surface or the structure being inspected.

The embodiments of the present disclosure are probes having transducer modules that can be comprised of twin-crystal components, that is, the pair of components 50, 52 and the pair of components 90, 92, respectively, which form a transmitting piezoelectric crystal and a receiving piezoelectric crystal, respectively. However, in an alternative embodiment, a probe is composed of a single piezoelectric crystal which is used for both transmission and reception of ultrasound.

Figure 10:
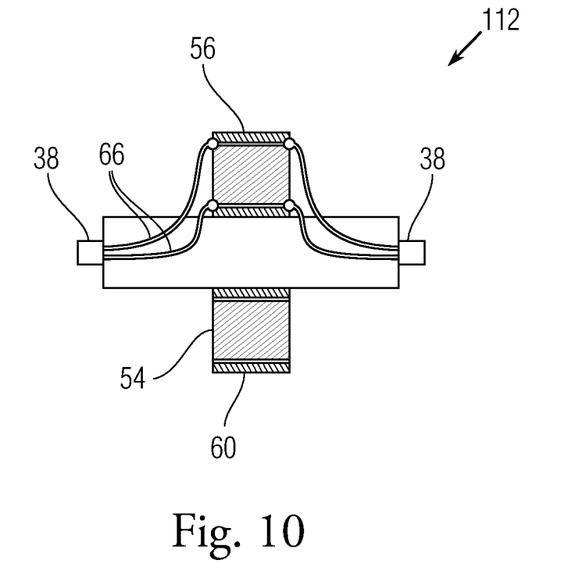
FIG. 10 is a diagram of a side cross-sectional view of an alternative embodiment of the radial transducer of FIGS. 2-5.
Figure 11:
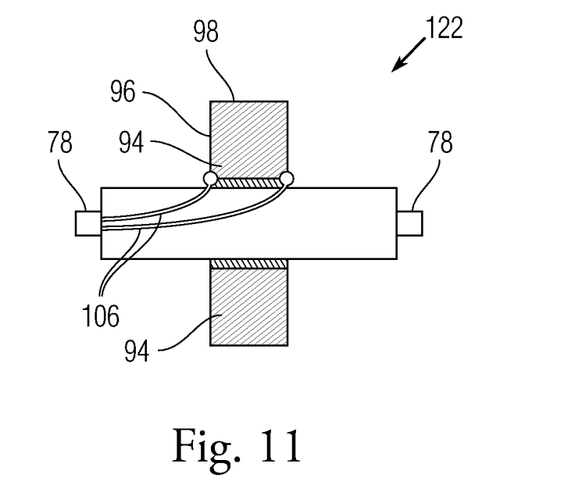
FIG. 11 is a diagram of a side cross-sectional view of an alternative embodiment of the radial transducer of FIGS. 6-9.

In this regard, FIG. 10 is a diagram of a side cross-sectional view of one such alternative embodiment of the radial transducer of FIGS. 2-5. More specifically, a transducer 112 includes a single piezoelectric crystal 54 having electroplates 56, 58, such as described above. The transducer 112 is used for both transmission and reception of ultrasound. Likewise, FIG. 11 is a diagram of a side cross-sectional view of an alternative embodiment of the radial transducer of FIGS. 6-9, in which a transducer 122 includes a single piezoelectric crystal 94 having electroplates 96, 98, such as described above. In the embodiments of FIGS. 10 and 11, the transducers 112 and 122 are used for both transmission and reception of ultrasound.

Each of the arrangements in which there is a single piezoelectric crystal 54, 94 in the transducers 112, 122 is similar to the dual crystal embodiments described above, except the construction of these arrangements lacks an acoustic barrier 48, 88 between a pair of piezoelectric crystals, as in the transducers 32, 72, respectively. Rather, in the embodiments with transducers 112, 122, the crystal 54, 94 is initially configured to transmit the ultrasonic signal generated upon application of electrical signals over the wires 66, 106, respectively. Then, the crystal 54, 94 is configured to receive the reflected ultrasonic signal, with that signal being directed to a digitizer connected via the wires 66, 106, respectively.

Figure 13:
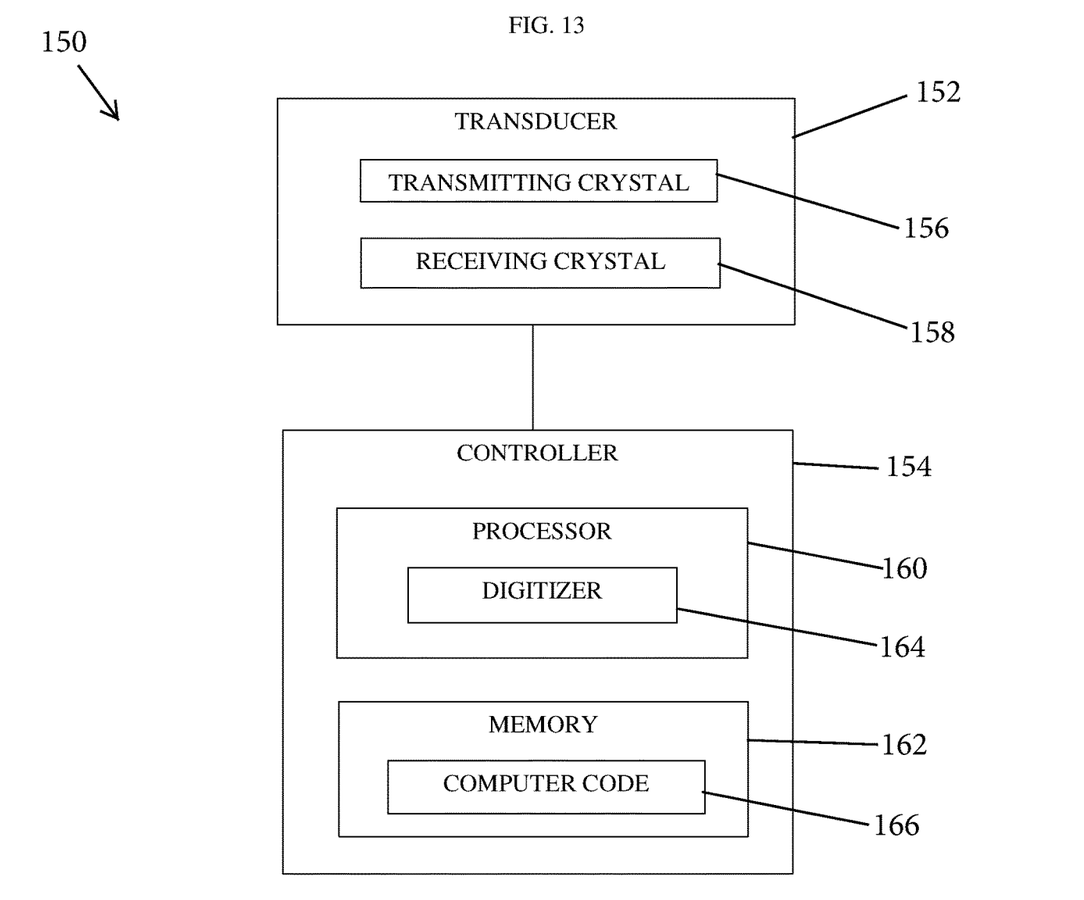
FIG. 13 is a schematic diagram of a system using the transducer of FIGS. 1-11.

This can be implemented by a system 150 such as shown in FIG. 13 in which a transducer 152 is connected to a controller 154 which is suitably configured, such as by code 166 executing in a processor 160 (described below). The transducer 152 includes a transmitting piezoelectric crystal 156 and a receiving piezoelectric crystal 158. In an embodiment, the crystals 156, 158 correspond to the crystals 50, 52 shown in FIGS. 3-5, or correspond to the crystals 90, 92 shown in FIGS. 7-9, with the crystals 156, 158 being distinct and separate piezoelectric crystals in a dual-crystal configuration as described above. In an alternative embodiment, the crystals 156, 158 are identical, being a single piezoelectric crystal, such as the single crystal 54, 94 shown in FIGS. 10-11, respectively, and operating as both a transmitting piezoelectric crystal and a receiving piezoelectric crystal, respectively, as described above.

The controller 154 includes a processor 160 and a memory 162. The processor 160 can be a microprocessor, an application specific integrated circuit (ASIC), or any known processor. The processor 160 instructs the controller 154 to generate electric signals to be applied to the transmitting crystal 156 for generating the ultrasound. The processor 160 includes a digitizer 164. For instance, the digitizer can comprise a signal processor for receiving and digitizing the electrical signals generated by the receiving crystal 158 in response to receiving the reflected ultrasound, or a general purpose processor configured by executing code to perform that function. The digitized electrical signals from the digitizer 164 can then be processed using known signal processing techniques to output information about the surface of the structure being inspected, as described herein. For example, the outputted information can be an image of the inspected surface. Accordingly, the digitizer 164 can in turn be connected to an output device such as a display for outputting the information such as the image.

The memory 162 of the controller 154 can include computer code 166, in any known computer language, representing instructions which are executed by the processor 160 to control the generation of the electrical signals applied to the transmitting crystal 156. In addition, the computer code 166 can also represent additional instructions for controlling the digitizer 164 to digitize the electrical signals generated by the receiving crystal 158. Furthermore, in one embodiment, when the crystals 156, 158 are distinct and form a dual-crystal configuration as described above, the processor 160 executing the computer code 166 distinguishes the electrical signals to and from each of the distinct crystals 156, 158. Execution of code, as referred to herein, should be understood as including other implementations that configure a processor, such as a script.

In an alternative embodiment, when the crystals 156, 158 are identical, as in the transducers 112, 122 having crystals 54, 94 in FIGS. 10-11, respectively, the processor 160 executing the computer code 166 is configured by the computer code 166 to switch the single piezoelectric crystal 54, 94 between transmit and receive modes. The transducers 112, 122 in such embodiments have the piezoelectric crystal 54, 94, respectively, connected by wires to induce a stress or strain in the crystal 54, 94, to generate ultrasound, by application of an electric signal from the controller 154.

Likewise, the transducers 112, 122 detect a stress or strain in the piezoelectric crystal 54, 94, respectively, in response to receiving reflected ultrasound, as a function of whether the single-crystal transducer 112, 122 is in a transmit or receive mode.

Figure 14:
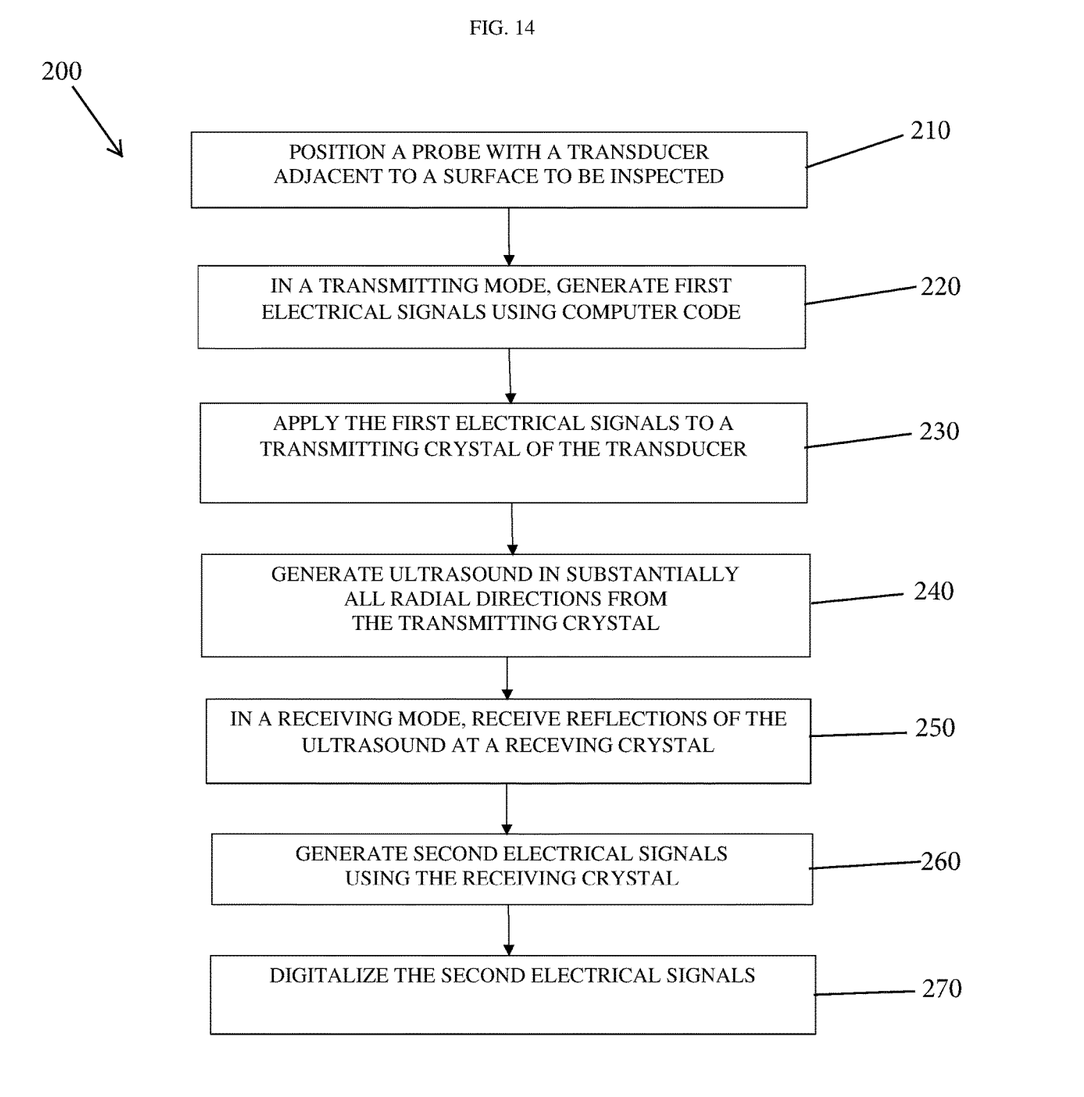
FIG. 14 is a flowchart of a method using the system of FIG. 13.

In a further embodiment, a method 200 is shown in FIG. 14 for inspecting a surface of a structure using the system 150 of FIG. 13 and the probes and transducers described above. In the method 200, a probe such as a dry-coupled wheel probe having a transducer, as described above in various embodiments, is positioned adjacent to a surface of a structure to be inspected in step 210. In step 220, in a transmitting mode, the system 150 generates first electrical signals using the computer code 166. In step 230, the first electrical signals are applied to a transmitting crystal 156 of the transducer 152, which causes the transmitting crystal to generate ultrasound in step 240 in substantially all radial direction from the transmitting crystal, as described above. In step 250, in a receiving mode, the system 150 receives reflections of the ultrasound at a receiving crystal 158 of the transducer 152. As described above, in an embodiment, the receiving crystal 158 is distinct from the transmitting crystal 156. In an alternative embodiment, the crystals 156, 158 are identical, as described above. In step 260, the receiving crystal 158 generates second electrical signals, which are output to the digitizer 164 of the controller 154. The digitizer 164 then digitizes the second electrical signals in step 270, for further processing to inspect the surface of the structure.

An additional embodiment of the present disclosure is a probe having an array of multiple piezoelectric crystals on a longer shaft, with the multiple crystals spaced apart at predetermined relatively small distances with an independent rotating member, composed of rubber or other dry coupling materials, for each of the respective crystals. The array can be constructed in accordance with any of the foregoing embodiments by spacing the piezoelectric crystals in the longitudinal direction (that is, perpendicular to the radial direction), such as by providing transducers at intervals along a shaft of a probe wheel. Such an array of crystals is beneficial for scanning or inspecting larger structures and producing ultrasonic scans more easily. Other embodiments of an array of multiple piezoelectric crystals include mounting the crystals on a longer straight shaft, a circular shaft, etc. Putting multiple piezoelectric crystals on a single shaft allows for fast two-dimensional (2D) scans of a flat or a relatively flat surface without the need to perform a raster scan in a zig-zag manner to cover an entire flat surface.

Figure 12:
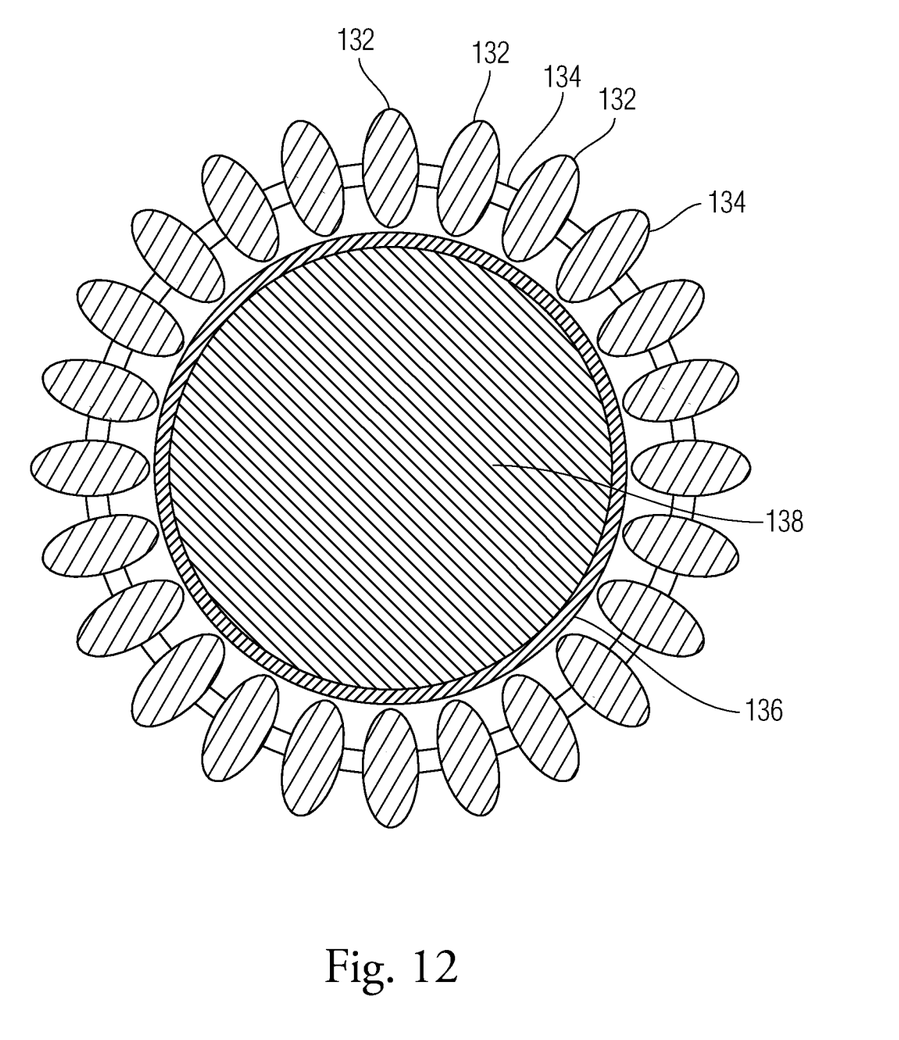
FIG. 12 is a diagram of a front cross-sectional view of multiple transducers in a further alternative embodiment.

FIG. 12 is a diagram of a front cross-sectional view of a further alternative embodiment, with a plurality of piezoelectric crystals 132 are arranged in a spaced-apart manner and are mounted in an array on a holding structure 134. In the embodiment of FIG. 12, the array is a circular array of piezoelectric crystals supported on a ring-shaped holding structure. As shown, they are evenly spaced in this embodiment. In the illustrated embodiment, therefore, the plurality of piezoelectric crystals 132 are evenly spaced apart around a circumference or perimeter 136 of a pipe 138 or other cylindrical structures, though they can be spaced apart on other shaped structures generally consistent with the foregoing. When provided in a circular arrangement, the piezoelectric crystals 132 are positioned to scan the whole circumferences 136 of the pipe 138 as the piezoelectric crystals 132 are rolled longitudinally or axially along the length of the pipe 138. Retention and rolling of the crystals 132 along the surface of the pipe 138 is attained by sizing the holding structure 134 or shaft to be bigger than the pipe 138 in order to enclose the pipe 138.

It is to be further understood that like or similar numerals in the drawings represent like or similar elements through the several figures, and that not all components or steps described and illustrated with reference to the figures are required for all embodiments or arrangements.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "contains", "containing", "includes", "including," "comprises", and/or "comprising," and variations thereof, when used in this specification, specify the presence of stated features, integers, steps, operations, elements, and/or components, but do not preclude the presence or addition of one or more other features, integers, steps, operations, elements, components, and/or groups thereof.

Terms of orientation are used herein merely for purposes of convention and referencing and are not to be construed as limiting. However, it is recognized these terms could be used with reference to an operator or user. Accordingly, no limitations are implied or to be inferred. In addition, the use of ordinal numbers (e.g., first, second, third) is for distinction and not counting. For example, the use of "third" does not imply there is a corresponding "first" or "second." Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

The subject matter described above is provided by way of illustration only and should not be construed as limiting. Various modifications and changes can be made to the subject matter described herein without following the example embodiments and applications illustrated and described, and without departing from the true spirit and scope of the invention encompassed by the present disclosure, which is defined by the set of recitations in the following claims and by structures and functions or steps which are equivalent to these recitations.

What is claimed is:

1. A transducer module, comprising:
   a first cylindrical member having a longitudinal axis;
   a first annular electroplate external to and adjacent to the first cylindrical member; and
   a second annular electroplate internal to and adjacent to the first cylindrical member,
   wherein the first and second annular electroplates apply a first electrical signal to the first cylindrical member to generate and emit sound waves in all radial directions relative to the longitudinal axis.

2. The transducer module of claim 1, wherein the emitted sound waves are ultrasonic waves.

3. The transducer module of claim 1, wherein the first cylindrical member is composed of a piezoelectric material.

4. The transducer module of claim 1, further comprising:
   a second cylindrical member;
   a third annular electroplate external to and adjacent to the second cylindrical member; and
   a fourth annular electroplate internal to and adjacent to the second cylindrical member,
   wherein, responsive to the second cylindrical member receiving a reflection of the sound waves from a test surface, the second cylindrical member vibrates, causing the third and fourth annular electroplates to generate a corresponding second electrical signal.

5. The transducer module of claim 4, wherein the second cylindrical member is composed of a piezoelectric material.

6. A transducer module, comprising:
a transmitting component including:
a first cylindrical member having a first longitudinal axis;
a first annular electroplate external to and adjacent to the first cylindrical member; and
a second annular electroplate internal to and adjacent to the first cylindrical member;
a receiving component including:
a second cylindrical member having a second longitudinal axis;
a third annular electroplate external to and adjacent to the second cylindrical member; and
a fourth annular electroplate internal to and adjacent to the second cylindrical member; and
an acoustic barrier positioned between the transmitting component and the receiving component,
wherein the first and second annular electroplates apply a first electrical signal to the first cylindrical member to generate and emit sound waves from the transmitting component in all radial directions relative to the first longitudinal axis,
wherein the acoustic barrier prevents the emitted sound waves from the transmitting component from being received by the receiving component, and
wherein, responsive to the receiving component receiving a reflection of the sound waves from a test surface, the second cylindrical member vibrates, causing the third and fourth annular electroplates to generate a corresponding second electrical signal.

7. The transducer module of claim 6, wherein the emitted sound waves are ultrasonic waves.

8. The transducer module of claim 6, wherein each of the first and second cylindrical members is composed of a piezoelectric material.

9. The transducer module of claim 6, wherein each of the first, second, third, and fourth electroplates has an annular shape with a centrally positioned electroplate aperture and a longitudinal electroplate axis coincident with a respective longitudinal cylindrical axis of the first and second cylindrical members.

10. The transducer module of claim 9, wherein the first and second electroplates are concentric rings; and
wherein the third and fourth electroplates are concentric rings.

11. A wheel probe for inspecting a test surface of a structure, with the wheel probe comprising:
a transducer module including:
a transmitting component including:
a first cylindrical member having a first longitudinal axis;
a first annular electroplate external to and adjacent to the first cylindrical member; and
a second annular electroplate internal to and adjacent to the first cylindrical member;
a receiving component including:
a second cylindrical member having a second longitudinal axis;
a third annular electroplate external to and adjacent to the second cylindrical member; and
a fourth annular electroplate internal to and adjacent to the second cylindrical member; and
a static acoustic barrier positioned between the transmitting component and the receiving component;
a pair of wheel members composed of a predetermined material for acoustically dry coupling the wheel members to the test surface; and
a rotating acoustic barrier between the wheel members, forming a wheel which rotates about the transducer,
wherein the first and second annular electroplates apply a first electrical signal to the first cylindrical member to generate and emit sound waves from the transmitting component in all radial directions relative to the longitudinal axis,
wherein the static and rotating acoustic barriers prevent the emitted sound waves from the transmitting component from being received by the receiving component, and
wherein, responsive to the receiving component receiving a reflection of the sound waves from the test surface, the second cylindrical member vibrates, causing the third and fourth annular electroplates to generate a corresponding second electrical signal.

12. The wheel probe of claim 11, wherein the predetermined material is rubber.

13. The wheel probe of claim 11, wherein each of the first, second, third, and fourth electroplates has an annular shape with a centrally positioned electroplate aperture and a longitudinal electroplate axis coincident with a respective longitudinal cylindrical axis of the first and second cylindrical members.

14. The wheel probe of claim 13, wherein the first and second electroplates are concentric rings, and wherein the third and fourth electroplates are concentric rings.

* * * * *

UNITED STATES PATENT AND TRADEMARK OFFICE
CERTIFICATE OF CORRECTION

| | |
|---|---|
| PATENT NO. | : 11,474,079 B2 |
| APPLICATION NO. | : 16/865915 |
| DATED | : October 18, 2022 |
| INVENTOR(S) | : Fadl Abdellatif and Sahejad Patel |

It is certified that error appears in the above-identified patent and that said Letters Patent is hereby corrected as shown below:

On the Title Page

(72) the first name of the first inventor: "Fadi Abdellatif"
Should read: Fadl Abdellatif Signed and Sealed this
Fourteenth Day of March, 2023

Katherine Kelly Vidal
*Director of the United States Patent and Trademark Office*